US010727271B2

(12) United States Patent
 Sugioka

(10) Patent No.: US 10,727,271 B2
(45) Date of Patent: *Jul. 28, 2020

(54) MEMORY DEVICE HAVING SOURCE CONTACTS LOCATED AT INTERSECTIONS OF LINEAR PORTIONS OF A COMMON SOURCE, ELECTRONIC SYSTEMS, AND ASSOCIATED METHODS

(71) Applicant: Micron Technology, Inc., Boise, ID (US)

(72) Inventor: Shigeru Sugioka, Hiroshima (JP)

(73) Assignee: Micron Trechnology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/982,251

(22) Filed: May 17, 2018

(65) Prior Publication Data

US 2018/0269254 A1 Sep. 20, 2018

Related U.S. Application Data

(63) Continuation-in-part of application No. 15/399,509, filed on Jan. 5, 2017, now Pat. No. 10,014,345.

(51) Int. Cl.
*H01L 27/22* (2006.01)
*G11C 11/16* (2006.01)
(Continued)

(52) U.S. Cl.
CPC .......... *H01L 27/222* (2013.01); *G11C 11/161* (2013.01); *G11C 11/165* (2013.01);
(Continued)

(58) Field of Classification Search
CPC .......... H01L 27/222–228; H01L 43/02; H01L 43/08; H01L 43/10; H01L 43/12; G11C 11/14–1697; G11C 2211/5615
See application file for complete search history.

(56) References Cited

U.S. PATENT DOCUMENTS 8,587,042 B2    11/2013  Kajiyama
8,963,236 B2 *  2/2015   Song ..................... H01L 27/228
                                                        257/334
(Continued)

FOREIGN PATENT DOCUMENTS

JP     20073177954 A     12/2007

OTHER PUBLICATIONS

Zhao et al., Architecting a Common-Source-Line Array for Bipolar Non-Volatile Memory Devices, Design, Automation & Test in Europe Conference & Exhibition, Mar. 12-16, 2012, pp. 1451-1454.

*Primary Examiner* — Younes Boulghassoul
(74) *Attorney, Agent, or Firm* — TraskBritt

(57) ABSTRACT

Memory devices include an array of memory cells including magnetic tunnel junction regions. The array of memory cells includes access lines extending in a first direction and data lines extending in a second direction transverse to the first direction. A common source includes first linear portions and second linear portions extending at an acute angle to each of the first direction and the second direction. Electronic systems include such a memory device operably coupled to a processor, to which at least one input device and at least one output device is operably coupled. Methods of forming such an array of memory cells including a common source.

20 Claims, 11 Drawing Sheets

(51) Int. Cl.
 *H01L 43/12* (2006.01)
 *H01L 43/02* (2006.01)
 *H01L 29/423* (2006.01)

(52) U.S. Cl.
 CPC ...... *G11C 11/1653* (2013.01); *G11C 11/1659* (2013.01); *H01L 27/228* (2013.01); *H01L 29/4236* (2013.01); *H01L 43/02* (2013.01); *H01L 43/12* (2013.01)

(56) References Cited

U.S. PATENT DOCUMENTS

| | | | |
|---|---|---|---|
| 10,453,895 B2 | 10/2019 | Sugioka | |
| 2007/0279963 A1* | 12/2007 | Tsuchida | G11C 11/1655 365/148 |
| 2008/0043514 A1* | 2/2008 | Ueda | G11C 7/02 365/148 |
| 2008/0203503 A1* | 8/2008 | Asao | H01L 27/228 257/421 |
| 2008/0239782 A1 | 10/2008 | Asao | |
| 2013/0221306 A1* | 8/2013 | Nam | H01L 45/1253 257/1 |
| 2013/0250661 A1 | 9/2013 | Sandhu et al. | |
| 2013/0334630 A1 | 12/2013 | Kula et al. | |
| 2013/0334631 A1 | 12/2013 | Kinney et al. | |
| 2014/0070342 A1 | 3/2014 | Sandhu et al. | |
| 2014/0138609 A1 | 5/2014 | Satoh et al. | |
| 2014/0264663 A1 | 9/2014 | Chen et al. | |
| 2015/0001654 A1 | 1/2015 | Sandhu et al. | |
| 2015/0028439 A1 | 1/2015 | Kula et al. | |
| 2015/0076485 A1 | 3/2015 | Sandhu et al. | |
| 2015/0076633 A1 | 3/2015 | Siddik et al. | |
| 2015/0137291 A1 | 5/2015 | Kula et al. | |
| 2015/0214472 A1 | 7/2015 | Sandhu et al. | |
| 2015/0249202 A1 | 9/2015 | Siddik et al. | |
| 2015/0295164 A1 | 10/2015 | Sandhu et al. | |
| 2015/0303372 A1 | 10/2015 | Meade et al. | |
| 2016/0104745 A1 | 4/2016 | Park et al. | |
| 2016/0111632 A1 | 4/2016 | Sandhu et al. | |
| 2016/0155932 A1 | 6/2016 | Chen et al. | |
| 2016/0204340 A1* | 7/2016 | Kumura | H01L 43/02 257/421 |
| 2016/0211440 A1 | 7/2016 | Siddik et al. | |

* cited by examiner

MEMORY DEVICE HAVING SOURCE CONTACTS LOCATED AT INTERSECTIONS OF LINEAR PORTIONS OF A COMMON SOURCE, ELECTRONIC SYSTEMS, AND ASSOCIATED METHODS

CROSS-REFERENCE TO RELATED APPLICATIONS

This application is a continuation-in-part application of U.S. patent application Ser. No. 15/399,509, filed Jan. 5, 2017, now U.S. Pat. No. 10,014,345, issued Jul. 3, 2018, titled "MAGNETIC MEMORY DEVICE WITH GRID-SHAPED COMMON SOURCE PLATE, SYSTEM, AND METHOD OF FABRICATION," the disclosure of which is incorporated herein in its entirety by this reference. The subject matter of this application is also related to the subject matter of U.S. patent application Ser. No. 15/653,181, filed Jul. 18, 2017, now U.S. Pat. No. 10,453,895, issued Oct. 22, 2019.

TECHNICAL FIELD

Embodiments disclosed herein relate to memory devices and electronic systems including a memory device. More specifically, embodiments disclosed herein relate to semiconductor structures and cell array structures for memory devices (e.g., Magnetic Random Access Memory (MRAM) devices), to electronic systems including such memory devices, and to methods of forming such memory devices.

BACKGROUND

MRAM is a non-volatile computer memory technology based on magnetoresistance. One type of MRAM cell is a spin torque transfer MRAM (STT-MRAM) cell, which includes a magnetic cell core supported by a substrate. As shown in FIG. 1, a known STT-MRAM cell 10 generally includes at least two magnetic regions, for example, a "fixed region" 12 (also known in the art as a "pinned region") and a "free region" 14, with a non-magnetic region 16 between the fixed region 12 and the free region 14. The fixed region 12, free region 14, and non-magnetic region 16 form a magnetic tunnel junction region (MTJ) of the STT-MRAM cell 10. The STT-MRAM cell 10 may also include a first electrode 18 operably coupled to the fixed region 12 and a second electrode 20 operably coupled to the free region 14. The fixed region 12 and the free region 14 may exhibit magnetic orientations that are either horizontally oriented ("in-plane") as shown in FIG. 1 by arrows, or perpendicularly oriented ("out-of-plane") relative to the width of the regions. The fixed region 12 includes a magnetic material that has a substantially fixed magnetic orientation (e.g., a non-switchable magnetic orientation during normal operation). The free region 14, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region 12 and the free region 14 are directed in opposite directions (e.g., north and south, east and west, south and north, or west and east, respectively). In the parallel configuration, the STT-MRAM cell 10 exhibits a lower electrical resistance across the magnetoresistive elements (e.g., the fixed region 12 and free region 14). This state of low electrical resistance may be defined as a "0" logic state of the STT-MRAM cell 10. In the anti-parallel configuration, the STT-MRAM cell 10 exhibits a higher electrical resistance across the magnetoresistive elements. This state of high electrical resistance may be defined as a "1" logic state of the STT-MRAM cell 10.

Switching of the magnetic orientation of the free region 14 may be accomplished by passing a programming current through the STT-MRAM cell 10 and the fixed region 12 and free region 14 therein. The fixed region 12 polarizes the electron spin of the programming current, and torque is created as the spin-polarized current passes through the cell 10. The spin-polarized electron current exerts torque on the free region 14. When the torque of the spin-polarized electron current passing through the cell 10 is greater than a critical switching current density ($J_c$) of the free region 14, the direction of the magnetic orientation of the free region 14 is switched. Thus, the programming current can be used to alter the electrical resistance across the magnetic fixed and free regions 12, 14. The resulting high or low electrical resistance states across the magnetoresistive elements enable the read and write operations of the STT-MRAM cell. After switching the magnetic orientation of the free region 14 to achieve the parallel configuration or the anti-parallel configuration associated with a desired logic state, the magnetic orientation of the free region 14 is usually desired to be maintained, during a "storage" stage, until the STT-MRAM cell 10 is to be rewritten to a different configuration (i.e., to a different logic state). Accordingly, the STT-MRAM cell 10 is non-volatile and holds its logic state even in the absence of applied power.

High density cell array layouts are desired to obtain STT-MRAM devices with high data storage capabilities. However, STT-MRAM conventionally requires higher current to read and/or write logic states compared to other non-volatile memory, such as NAND Flash memory. Several publications describe efforts to achieve high density cell array layout and/or to reduce the current required to read and/or write logic states in STT-MRAM devices. For example, U.S. Patent Application Publication No. 2007/0279963 to Kenji Tsuchida et al., filed Feb. 9, 2007, titled "Semiconductor Memory" (hereinafter "the '963 Publication") describes an STT-MRAM cell layout with a dual-access trench. The '963 Publication describes a conventional layout that achieves a cell size of $12F^2$, where F is a smallest feature size (e.g., width of a line, trench, or other feature). The '963 Publication describes staggering the cells to achieve a smaller $8F^2$ cell size. The article by Bo Zhao et al. titled "Architecting a Common-Source-Line Array for Bipolar Non-Volatile Memory Devices," published in the Proceedings of the Design, Automation & Test in Europe Conference & Exhibition held Mar. 12-16, 2012 (hereinafter "Zhao"), describes a source line that is parallel to a word line direction and that is used as a source for all cells along the source line. Zhao also describes a cell arrangement to achieve a $6F^2$ cell size.

DETAILED DESCRIPTION

Figure 1:
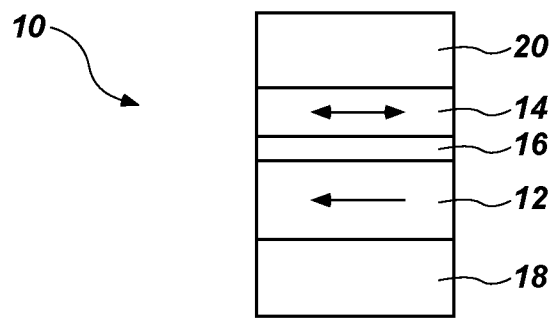
FIG. 1 is a simplified schematic side view of a known STT-MRAM cell.

The illustrations included herewith are not meant to be actual views of any particular systems or structures, but are merely idealized representations that are employed to describe embodiments of the present disclosure. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques and material types employed in the semiconductor industry. In addition, the description provided herein does not form a complete process flow for manufacturing semiconductor devices, cell array structures, or memory cells, and the semiconductor devices, cell array structures, and memory cells described below do not form a complete semiconductor device, cell structure, or memory cell. Only those process acts and structures necessary for one of ordinary skill in the art to understand the embodiments described herein are described in detail below. Additional acts to form a complete semiconductor device and a memory cell array may be performed by conventional techniques.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, any relational term, such as "first," "second," "over," "top," "bottom," "overlying," "underlying," etc., is used for clarity and convenience in understanding the disclosure and accompanying drawings and does not connote or depend on any specific preference, orientation, or order, except where the context clearly indicates otherwise.

As used herein, the terms "vertical" and "horizontal" merely refer to a drawing figure as oriented on the drawing sheet, and in no way are limiting of orientation of a memory cell, array, or semiconductor device, or any portion thereof.

As used herein, the term "forming" means and includes any method of creating, building, depositing, and/or patterning a material. For example, forming may be accomplished by atomic layer deposition (ALD), chemical vapor deposition (CVD), physical vapor deposition (PVD), sputtering, co-sputtering, spin-coating, diffusing, depositing, growing, or any other technique known in the art of semiconductor fabrication. Material may be formed and/or patterned into various shapes and configurations using known techniques, such as isotropic etching, anisotropic etching, chemical-mechanical polishing (CMP), ablating, etc. Depending on the specific material to be formed, the technique for forming the material may be selected by a person of ordinary skill in the art.

According to some embodiments, a memory cell array structure may include a common source providing electrical access to the sources of all memory cells in the array. The common source may include linear portions that extend in two directions that are at a first angle to data lines and at a second angle to access lines of the array. In other words, the common source may comprise a plate of conductive material having openings through which bit contacts for MTJs respectively extend. The MTJs of the memory cell array may be staggered, in that the MTJs of one column or row may be offset from MTJs of an immediately adjacent column or row. Thus, the common source may electrically connect to memory cells in two transverse directions (e.g., a row direction and a column direction). Memory (e.g., STT-MRAM) devices including the disclosed memory cell arrays with common source may exhibit improved (i.e., lower) electrical current requirements and may allow use of higher resistivity materials as source line material, compared to cell arrays with conventional linear source lines.

Figure 2A:
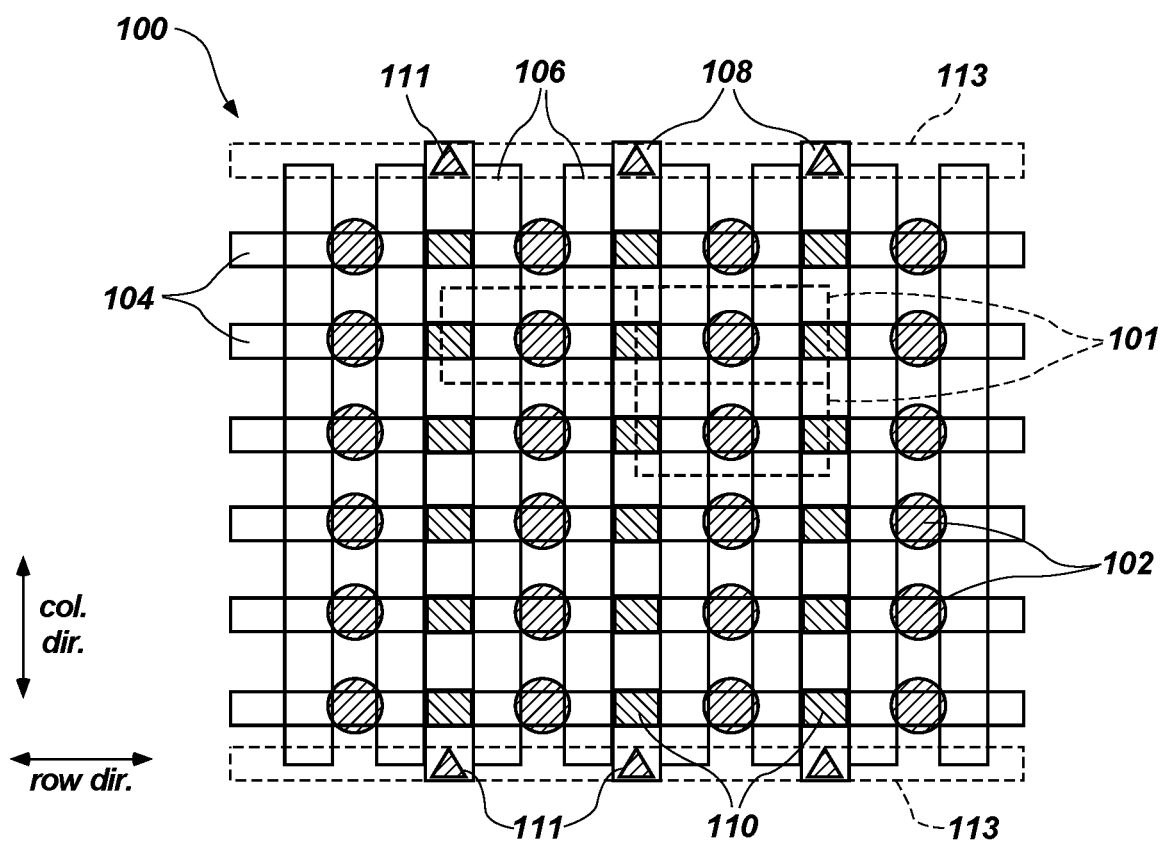
FIG. 2A is a simplified schematic top view of a linear array of STT-MRAM cells.
Figure 2B:
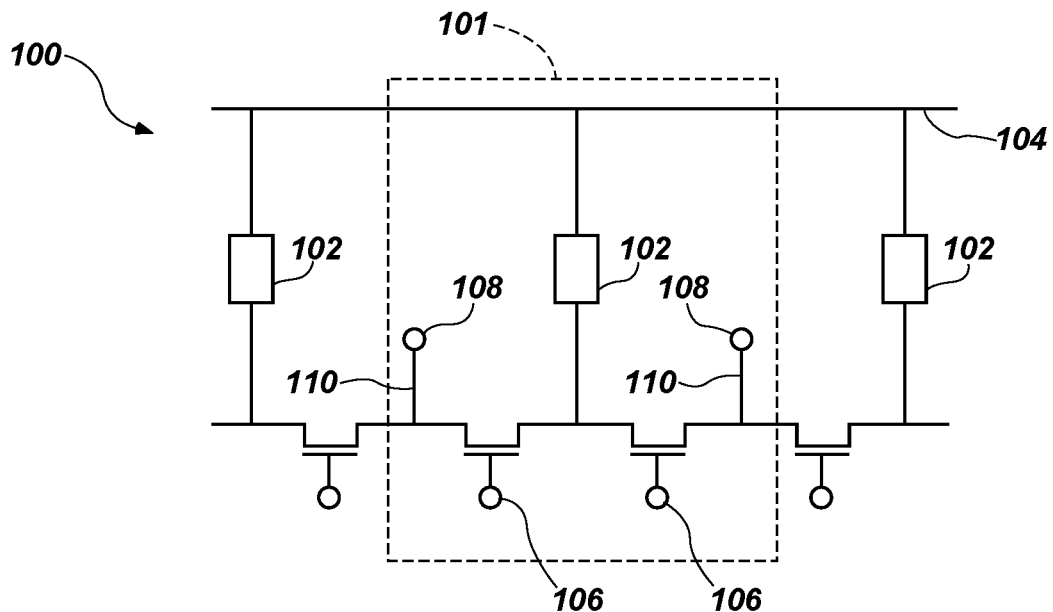
FIG. 2B is a cross-sectional electrical circuit diagram taken along and through a data line of the linear array of FIG. 2A.
Figure 2C:
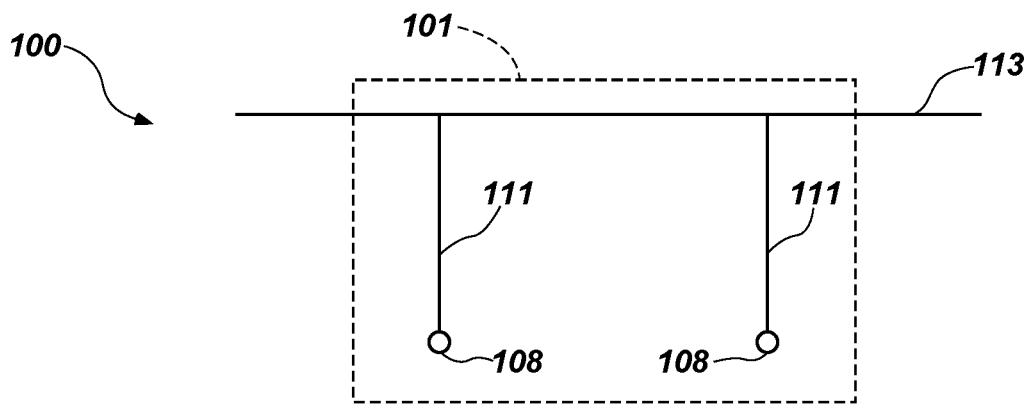
FIG. 2C is a schematic cross-sectional diagram taken along and through a source power line of the linear array of FIG. 2A.

FIGS. 2A-2C and the accompanying description thereof in this specification are provided to enhance an understanding by one of ordinary skill in the art of embodiments of the present disclosure, and are not admitted by the applicant as prior art for any purpose.

FIG. 2A illustrates a linear array 100 of STT-MRAM cells 101 including MTJs 102 shown by shaded circles in FIG. 2A. FIG. 2B is a cross-sectional electrical circuit diagram taken along and through a data line 104 of the linear array 100 of FIG. 2A. FIG. 2C is a schematic cross-sectional diagram taken along and through a source power line 113 of the linear array 100 of FIG. 2A. Certain elements shown in FIG. 2A are shown as transparent to more clearly illustrate structures that are overlying or underlying each other. The linear array 100 may include structures for operation of a device or system including the linear array 100 to electrically access and select, read from, write to, and/or erase data stored in the MTJs 102, such as data lines (e.g., bit lines) 104, access lines 106 (e.g., word lines), source lines 108, source contacts 110 (shown as shaded boxes in FIG. 2A), source line power contacts 111 (shown as shaded triangles in FIG. 2A), source power lines 113 (shown in dashed lines in FIG. 2A), and as well as other contacts, conductive lines, active areas, isolation trenches, substrates, dielectric materials, and layers that are not shown in FIG. 2A for clarity but that are known to one of ordinary skill in the art. The MTJs 102 of the linear array 100 may be aligned in a column direction (e.g., vertically from the perspective of FIG. 2A) parallel to the access lines 106 and in a row direction (e.g., horizontally from the perspective of FIG. 2A) perpendicular to the column direction and parallel to the data lines 104.

The data lines 104 are electrically conductive materials that may extend along (e.g., over) and may be operably coupled to MTJs 102 aligned in the row direction. The access lines 106 may be formed in access trenches formed in a semiconductor substrate underlying the MTJs 102 and may include an electrically conductive gate material and a gate dielectric material, forming an access device (e.g., transistor) for each respective MTJ 102. The access lines 106 may extend along (e.g., under and parallel to) MTJs 102 aligned in the column direction. In the configuration shown in FIG. 2A, two access lines 106 may be operably (e.g., electrically) coupled to access devices that are coupled to each column of MTJs 102, such that the linear array 100 is a so-called "dual-gate" structure of STT-MRAM cells 101.

The source lines 108 may also extend along (e.g., parallel to) MTJs 102 aligned in the column direction, such as between two adjacent columns of MTJs 102. The source contacts 110 may operably couple the source lines 108 to two access lines 106 of adjacent columns of MTJs 102. The source contacts 110 are not operably coupled to the data lines 104, other than the indirect connection through the access lines 106 and MTJs 102. Accordingly, the source lines 108 and source contacts 110 may be shared between two adjacent columns of MTJs 102. Source line power contacts 111 may be coupled to end portions of the source lines 108, which, in turn, may be coupled to one or more source power lines 113 for applying a voltage to the source lines 108.

In use and operation, when an STT-MRAM cell 101 including an MTJ 102 of the linear array 100 is selected to be programmed, a programming current is applied to the STT-MRAM cell 101, and the current is spin-polarized by the fixed region of the MTJ 102 and exerts a torque on the free region of the MTJ 102, which switches the magnetization of the free region to "write to" or "program" the MTJ 102. In a read operation of the STT-MRAM cell 101, a current is used to detect a resistance state of the MTJ 102.

To initiate programming of a particular STT-MRAM cell 101, peripheral read/write circuitry may generate a write current (i.e., a programming current) to the data line 104 and the source line 108 operably coupled (e.g., electrically coupled) to the MTJ 102 of the particular STT-MRAM cell 101. The polarity of the voltage between the data line 104 and the source line 108 determines the switch (or maintenance) in magnetic orientation of the free region in the MTJ 102. By changing the magnetic orientation of the free region with the spin polarity, the free region is magnetized according to the spin polarity of the programming current and the programmed logic state is written to the MTJ 102.

To read data from the MTJ 102, the peripheral read/write circuitry generates a read voltage to the data line 104 and the source line 108 through the MTJ 102 and the access lines 106 operably coupled to the MTJ 102. The programmed state of the STT-MRAM cell 101 relates to the electrical resistance across the MTJ 102, which may be determined by a potential difference (i.e., voltage) between the data line 104 and the source line 108. A high resistance across the MTJ 102 may be read as a logic state of "1," and a low resistance across the MTJ 102 may be read as a logic state of "0," for example.

Figure 3A:
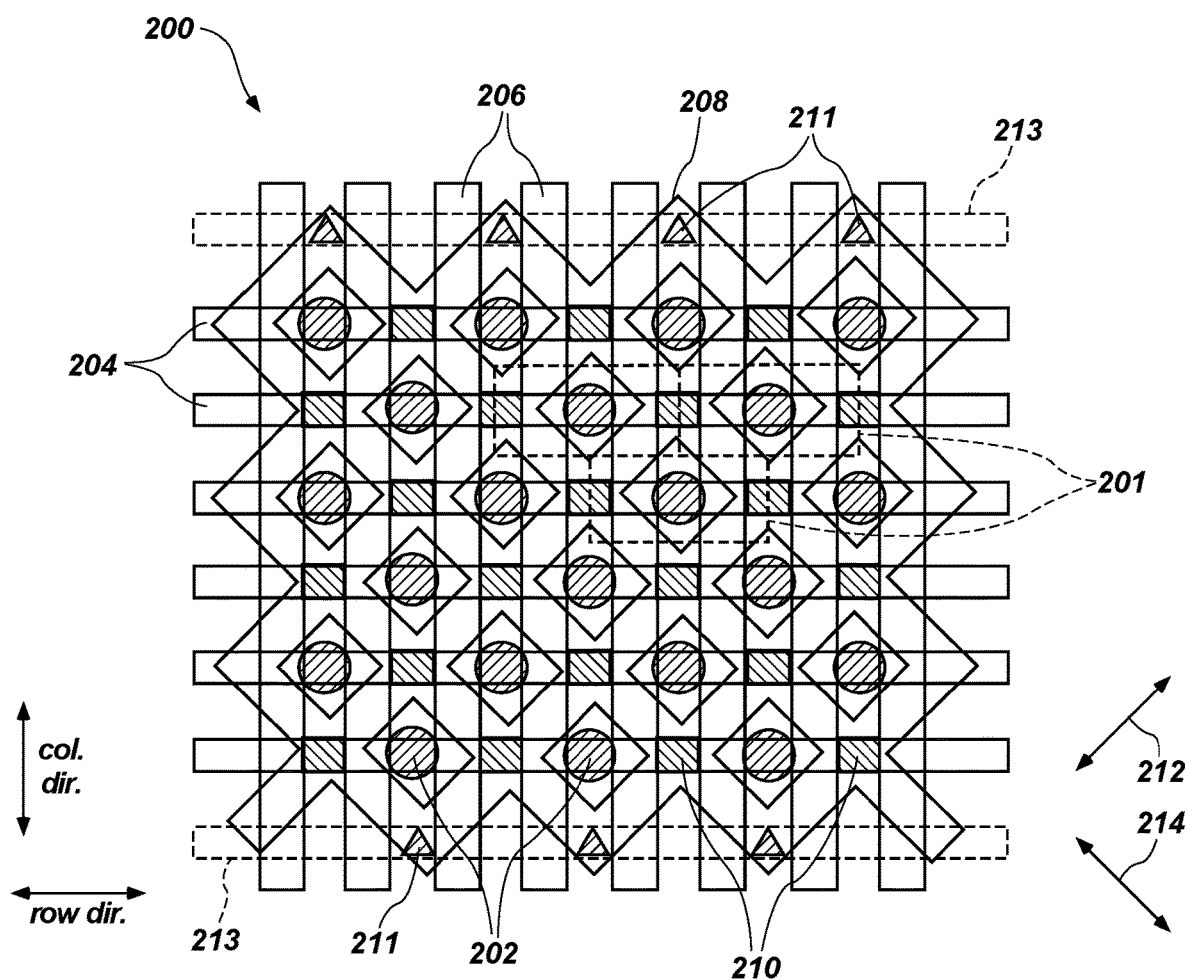
FIG. 3A is a simplified schematic top view of an array of cells according to an embodiment of the present disclosure.
Figure 3B:
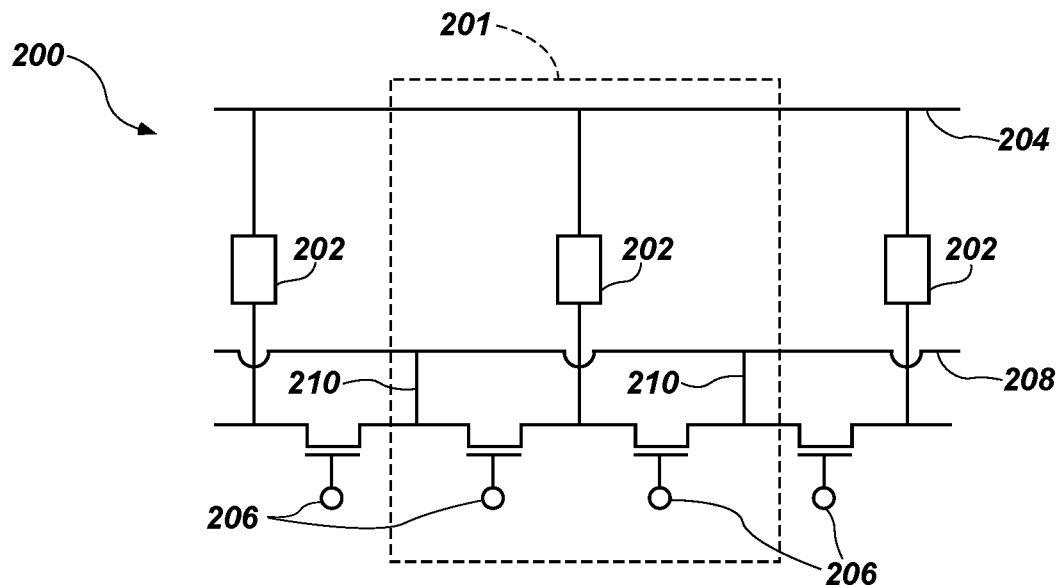
FIG. 3B is a cross-sectional electrical circuit diagram taken along and through a data line of the array of FIG. 3A.
Figure 3C:
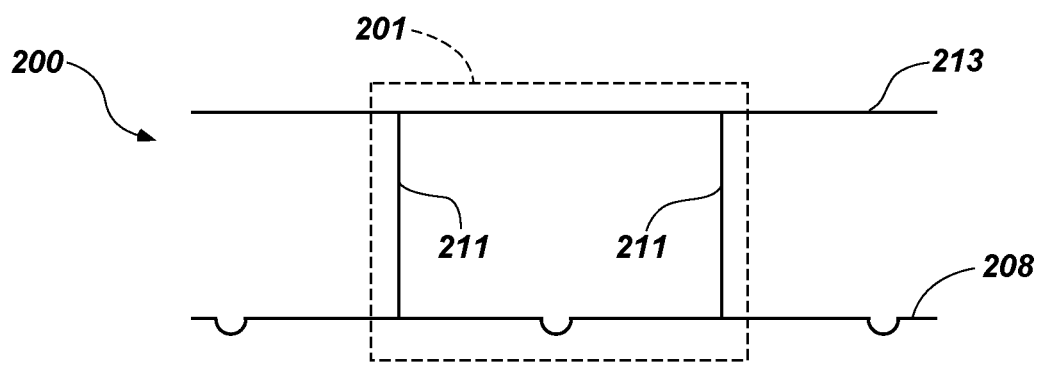
FIG. 3C is a schematic cross-sectional diagram taken along and through a source power line of the array of FIG. 3A.

FIG. 3A illustrates an array 200 of memory cells 201 including MTJs 202 shown by shaded circles in FIG. 3A. FIG. 3B is a cross-sectional electrical circuit diagram taken along and through a data line 204 of the array 200 of FIG. 3A. FIG. 3C is a cross-sectional electrical circuit diagram taken along and through a source power line 213 of the array 200 of FIG. 3A. Certain elements shown in FIG. 3A are shown as transparent to more clearly illustrate structures that are overlying or underlying each other. The array 200 may include structures for operation of a device or system including the array 200 to electrically access and select, read from, write to, and/or erase data stored in the MTJs 202, such as data lines 204 (e.g., bit lines), access lines 206 (e.g., word lines), a common source 208, source contacts 210 (shown as shaded boxes in FIG. 3A), source power contacts 211 (shown as shaded triangles in FIG. 3A), the source power lines 213 (shown in dashed lines in FIG. 3A), and as well as other contacts, conductive lines, active areas, isolation trenches, substrates, dielectric materials, and layers that are not shown in FIG. 3A for clarity but that are known to one of ordinary skill in the art. A column direction of the array 200 may be parallel to the access lines 206. A row direction of the array 200 may be perpendicular to the column direction and parallel to the data lines 204.

The MTJs 202 in the array 200 may be staggered, such that MTJs 202 in one column are offset (i.e., not aligned in a row direction) from MTJs 202 in an immediately adjacent column. Similarly, MTJs 202 in one row are offset (i.e., not aligned in a column direction) from MTJs 202 in an immediately adjacent row. The MTJs 202 of the array 200 may be aligned in one or more directions at an angle to the column direction (i.e., a direction parallel to the access lines 206) and to the row direction (i.e., a direction parallel to the data lines 204). By way of example and not limitation, the MTJs 202 may be aligned in a first angled direction 212 at an angle of between about 35 degrees and about 55 degrees, such as about 45 degrees, from the column direction and at a complementary angle from the row direction. The MTJs 202 may also be aligned in a second angled direction 214 at an angle of between about 35 degrees and about 55 degrees, such as about 45 degrees, from the row direction and at a complementary angle from the column direction.

Figure 3D:
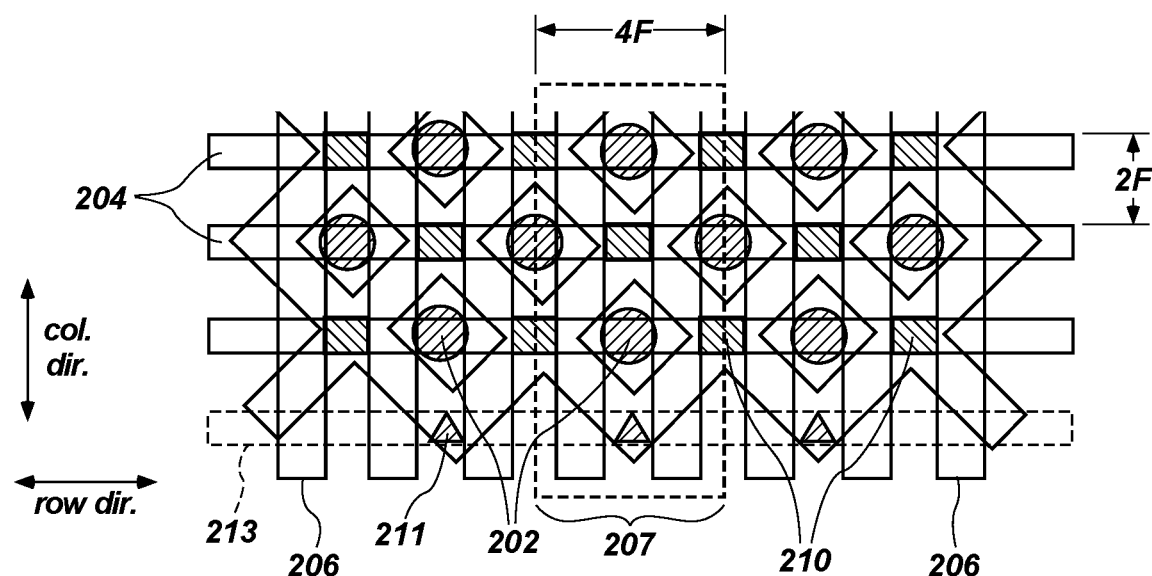
FIG. 3D is a simplified schematic top view of a portion of the array of FIG. 3A.

Each of the memory cells 201 of the array 200 may have a cell size of about $8F^2$, where cell size is given in units of $F^2$ and F is the minimum feature size (e.g., width of a line, trench, or other feature). The feature size F may be the same in the column and row directions or may be different in the column and row directions. FIG. 3D illustrates a portion of the array 200 of FIG. 3A with the memory cells 201 having an $8F^2$ configuration with 4F in the row direction and 2F in the column direction. By way of example, a pitch (i.e., line width plus required spacing) in the column direction may include a unit F for the width of the data lines 204 (e.g., bit lines) and another unit F for the spacing between the data lines 204, resulting in a combined 2F in the column direction. A pitch in the row direction may include, for example, the width of the access lines 206 (e.g., word lines) being half of the width of the data lines 204 if the access lines 206 are shared with an adjacent memory cell 201, the width of a source contact 210, the width of an adjacent access line 206, and half of the space between features, resulting in 4F of a paired access line 207, which results in an overall area of 8F$^2$ (i.e., 2F*4F).

The data lines 204 are electrically conductive materials that may extend along (e.g., over) and may be operably coupled to MTJs 202 aligned in the row direction, being MTJs 202 in every other column. The access lines 206 may be formed in access trenches formed in a semiconductor substrate underlying the MTJs 202 and may include an electrically conductive gate material and a gate dielectric material, forming an access device for each respective MTJ 202. The access lines 206 may extend along (e.g., under and parallel to) MTJs 202 aligned in the column direction, being MTJs 202 in every other column. Similar to the configuration described above in connection with FIG. 2A, two access lines 206 of the array 200 illustrated in FIG. 3A may be operably coupled to access devices coupled to each column of MTJs 202, such that the array 200 is a dual-gate structure of memory cells 201. The dual-gate arrangement, in comparison to a so-called "single-gate" arrangement in which a single word line is operably coupled to each column of cells, may result in an increase of gate width, and therefore current drivability, by connection of two selection transistors in parallel to each MTJ 202. Some conventional STT-MRAM memory cells with dual-gate structures may have a cell size of about 12F$^2$. However, the layout of the cells 201 of the present disclosure may result in a cell size of about 8F$^2$. In operation, certain access lines 206 may be unselected by applying a negative voltage to the access lines 206.

Figure 4A:
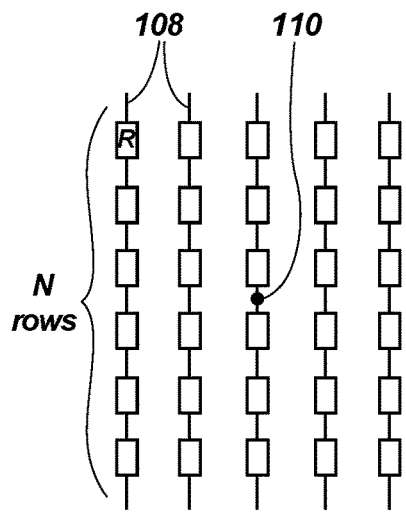
FIG. 4A shows a representation of a linear array of cells to illustrate resistive properties of the linear array.
Figure 4B:
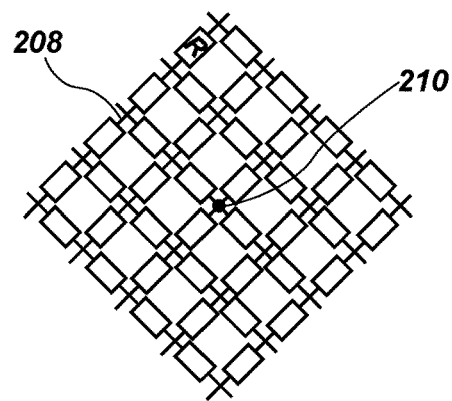
FIG. 4B shows a representation of an array of cells according to an embodiment of the present disclosure to illustrate resistive properties of the array.

FIG. 4A illustrates resistive properties of the source lines 108 of the linear array 100 shown in FIG. 2A and FIG. 4B illustrates resistive properties of the common source 208 shown in FIG. 3A. Contacts 111 (FIG. 2A) for applying voltage to the source lines 108 may be positioned at end portions of the source lines 108, such as at a top and bottom of the source line 108 as illustrated in FIG. 4A. Similarly, source power contacts 211 (FIG. 3A) for applying voltage to the common source 208 may be positioned at end portions of the common source 208. A maximum resistance of the common source 208 may be reduced compared to a maximum resistance of the source line 108. As shown in FIG. 4A, a maximum resistance of each source line 108 may be estimated by considering the source line 108 as a linear series of resistors (illustrated as rectangles) between each source contact 110. A maximum electrical resistance through the source line 108 at a source contact 110 in a column of N cells may be about R*N/2, where R is a resistance of a segment of the source line 108 between adjacent source contacts 110.

As shown in FIG. 4B, a maximum resistance of the common source 208 may be estimated by computer simulation by considering the common source 208 as a two-dimensional grid of resistors (illustrated as rectangles) with a source contact 210 at each grid intersection between the resistors. A maximum electrical resistance through the common source 208 at a source contact 210 in a column of N cells may be estimated as about R, where R is a resistance of a segment of the common source 208 between adjacent source contacts 210. Thus, where the number N of cells in a column is greater than 2, the common source 208 may exhibit a significantly reduced resistance compared to linear source lines 108. The reduced resistance of the common source 208 may allow a reduced current to be applied to a source of each memory cell 201.

In addition, since the resistance of the common source 208 to access any given cell 201 in the array 200 is not significantly dependent on the number of cells in the array 200, a nominal resistance of a material selected for the common source 208 is less significant than in materials selected for the linear source lines 108 of the linear array 100. Accordingly, conductive materials having relatively higher resistance may be selected for the common source 208 compared to materials selected for linear source lines 108.

By way of example and not limitation, a copper source line 108 or common source 208 may have a resistance of about 2.45-3.93Ω per cell 101, 201 assuming a line width of between about 21 nm and about 23 nm and a line height of about 55 nm. A tungsten source line 108 may have a resistance of about 13.38-17.47Ω per cell 101 assuming a line width of between about 21 nm and about 23 nm and a line height of about 30 nm. A tungsten common source 208 may have a resistance of about 18.93-21.47Ω per cell 201 assuming a line width of between about 21 nm and about 23 nm and a line height of about 30 nm. Based on these assumptions, an estimated maximum resistance through the source line 108 or through the common source 208 is identified in Table 1 below. The minimum line width of the common source 208 is a minimum width thereof between adjacent cells 201.

TABLE 1

| Source Type | Material and Line Height | Minimum Line Width | Maximum Resistance (Ω) for 128 Bits Per Column | Maximum Resistance (Ω) for 256 Bits Per Column | Maximum Resistance (Ω) for 512 Bits Per Column | Maximum Resistance (Ω) for 1,024 Bits Per Column |
|---|---|---|---|---|---|---|
| Source Line 108 | Copper, 55 nm line height | 23 nm | 160 | 310 | 630 | 1260 |
| | | 22 nm | 180 | 350 | 700 | 1400 |
| | | 21 nm | 210 | 410 | 820 | 1640 |
| | Tungsten, 30 nm line height | 23 nm | 860 | 1710 | 3430 | 6850 |
| | | 22 nm | 950 | 1910 | 3810 | 7620 |
| | | 21 nm | 1120 | 2240 | 4470 | 8940 |
| Common Source 208 | Copper, 55 nm line height | 23 nm | 3.5 | 3.5 | 3.5 | 3.5 |
| | | 22 nm | 3.6 | 3.6 | 3.6 | 3.6 |
| | | 21 nm | 3.9 | 3.9 | 3.9 | 3.9 |
| | Tungsten, 30 nm line height | 23 nm | 13.4 | 13.4 | 13.4 | 13.4 |
| | | 22 nm | 14.9 | 14.9 | 14.9 | 14.9 |
| | | 21 nm | 17.5 | 17.5 | 17.5 | 17.5 |

By way of example, an acceptable maximum external resistance value for dual gate arrangements may be about 1000Ω or less to achieve sufficient current for writing data to the cells 101, 201, such as when a diameter of the MTJs 102, 202 is about 20-30 nm and the MTJs 102, 202 have a magnetic field oriented perpendicular to a substrate. Accordingly, tungsten may not be a viable option for the source lines 108 having 256 to 512 cells (e.g., "bits") per column in the array 100 illustrated in FIG. 2A. Tungsten may only be available for higher line widths and lower bits per column, such as at least about 22 nm line width and 128 bits or less per column, since smaller line widths and/or higher bits per column made from tungsten exhibit maximum resistance values more than 1000Ω. Moreover, source lines 108 may not be feasible with 1,024 bits per column regardless of whether copper or tungsten is selected for the source lines 108 since the maximum resistance is greater than 1000Ω using either material.

On the other hand, when an array 200 having a common source 208 (FIG. 3A) is used, rather than a linear array 100 having source lines 108 (FIG. 2A) as described above, resistance values may be well below the 1000Ω threshold (e.g., about 20Ω or less) for all line widths between about 21 nm and about 23 nm and for all quantities between 128 and 1,024 bits per column using either copper or tungsten for the common source 208. Thus, the common source 208 configuration allows the use of different materials (e.g., materials having higher nominal resistance), arrays 200 having a higher number of cells (e.g., bits) per column, and/or linear portions of the common source 208 having a smaller line width and/or height. Tungsten may have advantages over copper when employed as a source material in manufacturability, reduction of impurities and contamination of adjacent features, smaller line height, and cost, for example.

Although copper and tungsten are analyzed and discussed above as a comparative example and to show certain advantages of the common source configuration, additional conductive materials may also be used as a material for the common source 208. For example, copper, tungsten, titanium, tantalum, aluminum, silver, gold, conductive silicides thereof, conductive nitrides thereof, or combinations thereof may be selected and used for the common source 208.

Figure 5:
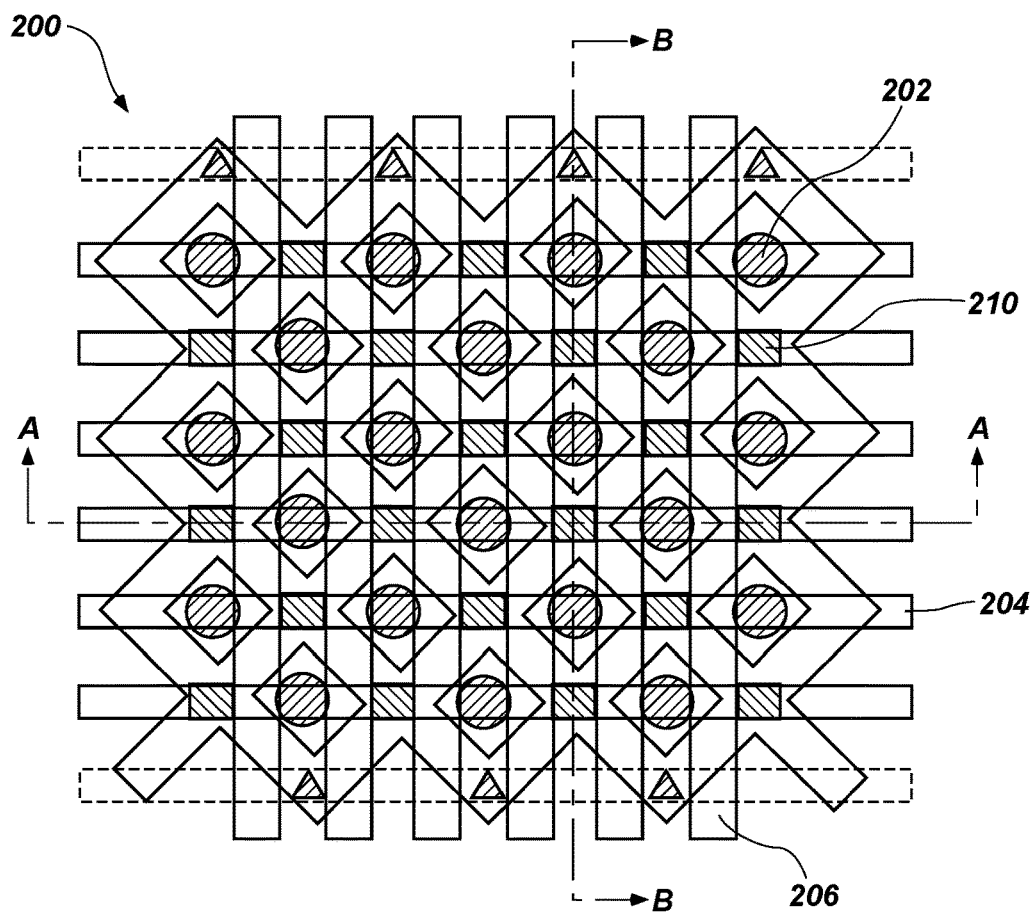
FIG. 5 is a simplified schematic top view of the array of cells according to the embodiment of FIG. 3A.

FIG. 5 illustrates the array 200 of FIG. 3A, with section lines A-A and B-B identified. The section line A-A extends through a row of MTJs 202 and source contacts 210 and along a data line 204. The section line B-B extends through a column of MTJs 202 and source contacts 210 and parallel to access lines 206.

Figures 6A, 6B, 6C:
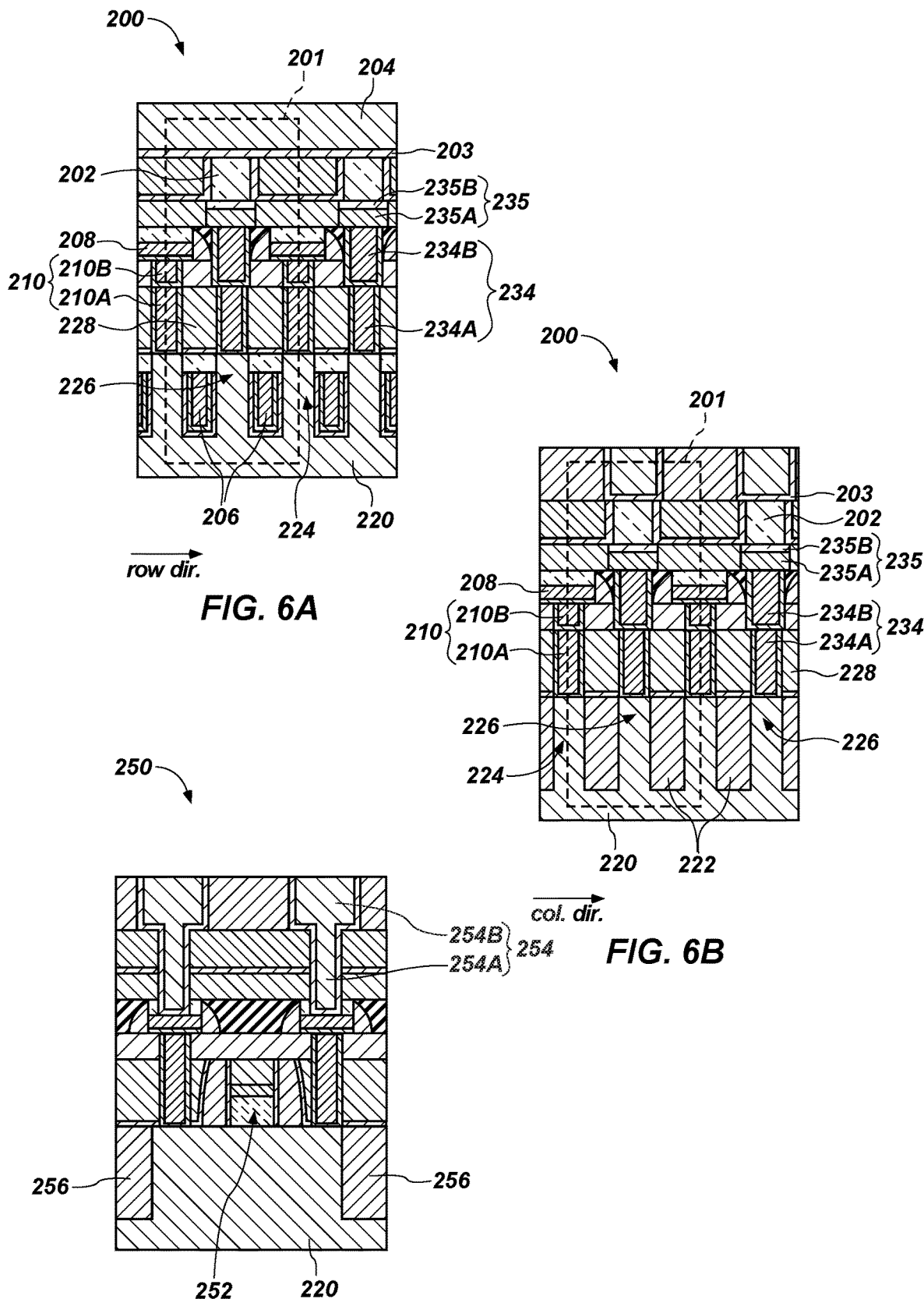
FIG. 6A shows a cross-sectional view of the array of cells taken from line A-A of FIG. 5.
FIG. 6B shows a cross-sectional view of the array of cells taken from line B-B of FIG. 5.
FIG. 6C shows a cross-sectional view of a peripheral region of a semiconductor device including the array of cells.
Figure 6D:
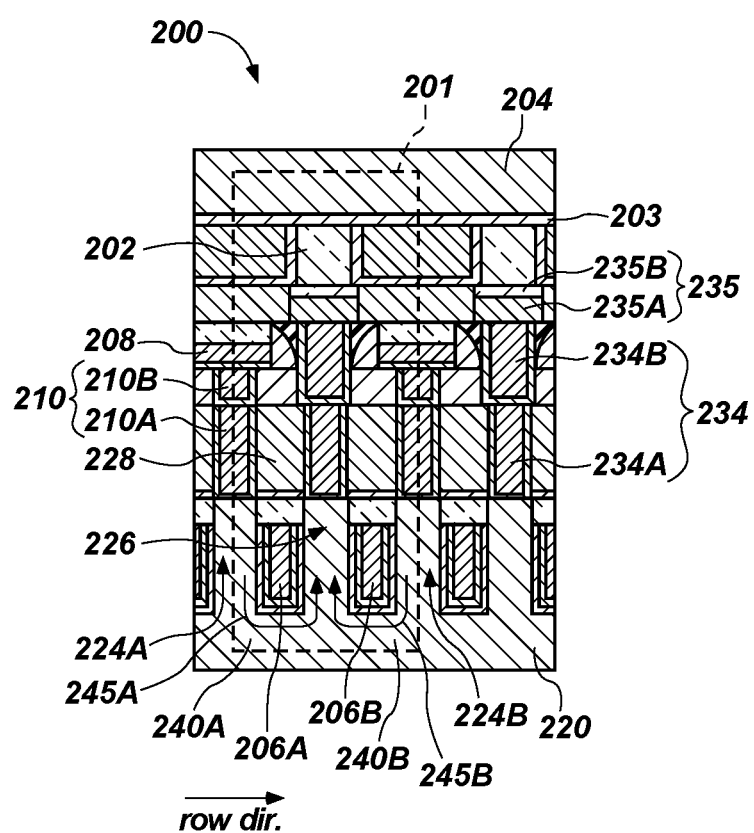
FIG. 6D shows a cross-sectional view of the embodiment of the array of cells of FIG. 6A.

FIGS. 6A-6D illustrate cross-sectional views of the array 200 of FIG. 5. FIG. 6A shows a cross-sectional view of the array 200 through section line A-A of FIG. 5. FIG. 6B shows a cross-sectional view of the array 200 through section line B-B of FIG. 5. FIG. 6C shows a cross-sectional view of a peripheral portion 250 of a memory device including the array 200. FIG. 6D shows a cross-sectional view of the embodiment of the array 200 of FIG. 6A.

Referring to FIGS. 6A and 6B, the access lines 206 may be formed on or in a semiconductor substrate 220. The semiconductor substrate 220 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in this description, previous process stages may have been utilized to form material, regions, or junctions in the base semiconductor structure or foundation.

By way of example and not limitation, the access lines 206 may be formed of one or more conductive materials, such as a tungsten material at least partially surrounded by a titanium nitride material. Portions (e.g., lower portions) of the access lines 206 may be electrically isolated from the surrounding semiconductor substrate 220 by a dielectric material, such as a silicon dioxide material. An upper portion of the access lines 206 may include, for example, a conductive metal silicide material, such as tungsten silicide. A dielectric gate material may be positioned over the access lines 206. The access lines 206 may extend in the column direction (i.e., into-and-out of the page when viewed in the perspective of FIG. 6A, left-and-right when viewed in the perspective of FIG. 6B), with two access lines 206 corresponding to each memory cell 201. Shallow trench isolation (STI) regions 222 of a dielectric material may be positioned in the semiconductor substrate 220 to electrically isolate adjacent memory cells 201 from each other. Portions of the semiconductor substrate 220 between the access lines 206 of adjacent cells 201 may define a semiconductor source region 224. Portions of the semiconductor substrate 220 between the access lines 206 of a single cell 201 may define a semiconductor drain region 226. In certain operations (e.g., writing data from a "1" state to a "0" state), the semiconductor source region 224 may act as a drain, while the semiconductor drain region 226 may act as a source. Accordingly, the nomenclature for the semiconductor source region 224 and the semiconductor drain region 226 is used for convenience and clarity in understanding this disclosure, but it is to be understood that the functions thereof may be switched during certain operations.

One or more dielectric materials 228 (e.g., a gate oxide material) may be positioned over the semiconductor substrate 220 and access lines 206. Semiconductor material may be disposed over the one or more dielectric materials 228 forming the active region for the channel. Conductive source contacts 210 (including lower source contact portions 210A and upper source contact portions 210B) and the conductive cell contacts 234 may extend from the semiconductor substrate 220 through the one or more dielectric materials 228. The common source 208 may be positioned over and operably coupled to the source contacts 210. As discussed above, the common source 208 may be configured as a grid of conductive material that is operably coupled to adjacent cells 201 in both the row direction and the column direction. A conductive cell contact 234 (including lower contact portion 234A and upper contact portion 234B) may be positioned over and operably coupled to each of the drain regions 226. The conductive cell contact 234 may include one or more conductive materials. By way of non-limiting example, the lower contact portion 234A and the upper contact portion 234B may each include a tungsten material at least partially surrounded by a titanium nitride material. MTJ lower electrode material 235 (including lower MTJ portion 235A and upper MTJ portion 235B) may be positioned over and operably coupled to the upper contact portion 234B of the conductive cell contact 234. The MTJ lower electrode material 235 may include a titanium nitride material in the lower MTJ portion 235A and a tantalum material in the upper MTJ portion 235B over the titanium nitride material, for example. In some embodiments, other conductive materials may be used for the conductive cell contact 234, as selected by one of ordinary skill in the art.

The MTJs 202 may be respectively positioned over and may be operably coupled to the conductive cell contacts 234 through the MTJ lower electrode material 235. The MTJs 202 may include a fixed magnetic region and a free magnetic region separated by a non-magnetic region, as discussed above. The fixed and free magnetic regions may have a magnetic orientation that is substantially parallel to the semiconductor substrate 220 (i.e., horizontally from the perspective of FIGS. 6A and 6B) or, alternatively, may have a magnetic orientation that is substantially perpendicular to the semiconductor substrate 220 (e.g., vertically from the perspective of FIGS. 6A and 6B).

The data lines 204 may be positioned over and operably coupled to the MTJs 202. A material layer 203 may optionally be formed between the data lines 304 and the MTJs 302. In some embodiments, the material layer 203 may be configured to apply a spin current to the MTJs 302. The data lines 204 may extend in the row direction. The data lines 204 may include one or more conductive materials, such as copper, tungsten, titanium, tantalum, conductive nitrides thereof, conductive silicides thereof, or combinations thereof, for example.

Referring to FIG. 6C, the peripheral portion 250 of a device including the array 200 of memory cells 201 (FIGS. 6A and 6B) may include, for example, read/write circuitry, a bit line reference, and an amplifier on or over the semiconductor substrate 220. The read/write circuitry may include access devices (e.g., transistors) 252 and peripheral conductive lines 254. Peripheral isolation trenches 256 filled with a dielectric material (e.g., silicon dioxide) may be positioned in the semiconductor substrate 220 to electrically isolate adjacent access transistors 252.

By way of example and not limitation, the peripheral conductive lines 254 may include copper, tungsten, or a combination of copper and tungsten. In some embodiments, an upper portion 254B of the peripheral conductive lines 254 may include copper and a lower portion 254A of the peripheral conductive lines 254 may include tungsten. In some embodiments, both the upper portion 254B and the lower portion 254A of the peripheral conductive lines 254 may include copper, or both the upper portion 254B and the lower portion 254A may include tungsten. The peripheral conductive lines 254 including the upper portion 254B and the lower portion 254A may operably connect the access transistors 252 of the peripheral portion 250 to the memory cells 201 (FIGS. 6A and 6B) of the array 200.

Referring to FIG. 6D, each individual memory cell 201 may include an access device configured as a dual-gate, dual-channel access device (e.g., access transistor) coupled to the storage element. For example, the memory cell 201 of FIG. 6A includes access lines 206A, 206B forming two gates for the access device for the individual memory cell 201. Corresponding active regions 240A, 240B associated with a common conductive cell contact 234 may provide different channels for the access device. As a result, the first active region 240A provides a first channel for its adjacent conductive source contact 210 (e.g., source 224A), the first access line 206A (e.g., first gate), and the conductive cell contact 234 (e.g., drain region 226). The second active region 240B provides a second channel for its adjacent conductive source contact 210 (e.g., source 224B), the second access line 206B (e.g., second gate), and the conductive cell contact 234 (e.g., drain region 226). In operation, current may flow, for example, from the first source 224A and the second source 224B to the drain region 226 by passing through the active region 240A and the second active region 240B, respectively, as shown by direction lines 245A and 245B. At other stages of operation, the current direction may be reversed. In other words, the current may flow from the region designated as the drain region 226, through the first active region 240A and the second active region 240B, to each of the regions designated as the first source 224A and the second source 224B, respectively.

Accordingly, a memory device is disclosed that includes an array of memory cells. Each of the memory cells of the array may include at least one access line extending in a first (e.g., column) direction, and a cell contact operably coupled to an access device (e.g., a drain side of the access device). A magnetic tunnel junction region may be operably coupled to the cell contact. At least one data line may be operably coupled to the magnetic tunnel junction region and may extend in a second (e.g., row) direction transverse to the column direction. At least one source contact may be operably coupled to the access device (e.g., on a source side of the access device). A common source may be operably coupled to the at least one source contact. The common source may include intersecting regions of first linear portions and second linear portions extending transverse to one another. Each of the first linear portions and the second linear portions may extend at an acute angle to each of the first direction and the second direction. The common source may operably couple the at least one source contact of each of the memory cells of the array to the at least one source contact of adjacent memory cells of the array in both the first direction and the second direction.

Figure 7:
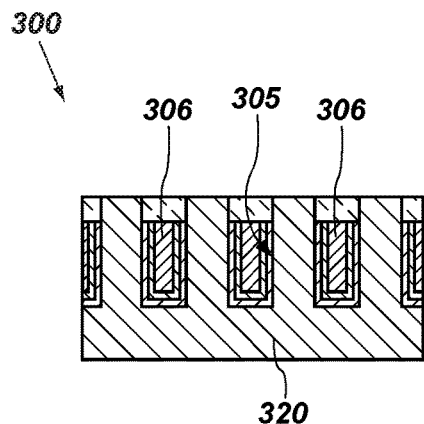
FIGS. 7 through 14 show a method of forming an array of memory cells according to an embodiment of the present disclosure.

FIGS. 7 through 14 show a method of forming an array 300 of memory cells 301 according to an embodiment of the present disclosure. Referring to FIG. 7, a semiconductor substrate 320 may be provided. Dielectric STI regions and access line trenches 305 may be formed in the semiconductor substrate 320. The access line trenches 305 may be at least partially filled with one or more conductive materials to form access lines 306 (e.g., word lines). For example, the access line trenches 305 may be lined with a conformal dielectric material (e.g., silicon dioxide) and an outer conductive material, such as titanium nitride, may be conformally formed over inner surfaces of the dielectric material within the access line trenches 305. The remaining portion of the access line trenches 305 may be filled with an inner conductive material, such as tungsten. An upper portion of the conductive material within the access line trenches 305 may be converted to a metal silicide material, such as tungsten silicide, by diffusing silicon into the conductive material, to form the access lines 306.

Figure 8:
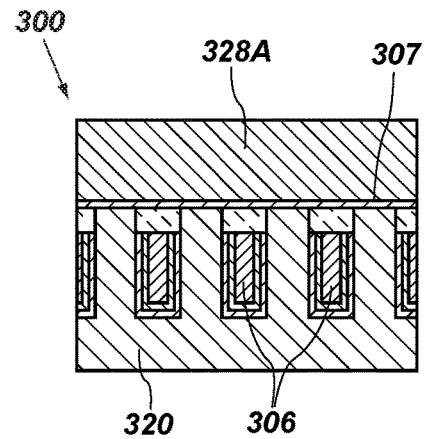

Referring to FIG. 8, a gate dielectric material 307 and a first interlayer dielectric material 328A may be formed over the semiconductor substrate 320 and access lines 306. For example, the gate dielectric material 307 may be a silicon dioxide material. The first interlayer dielectric material 328A may be one or more dielectric materials such as oxides (e.g., silicon dioxide) and/or nitrides (e.g., silicon nitride).

Figure 9:
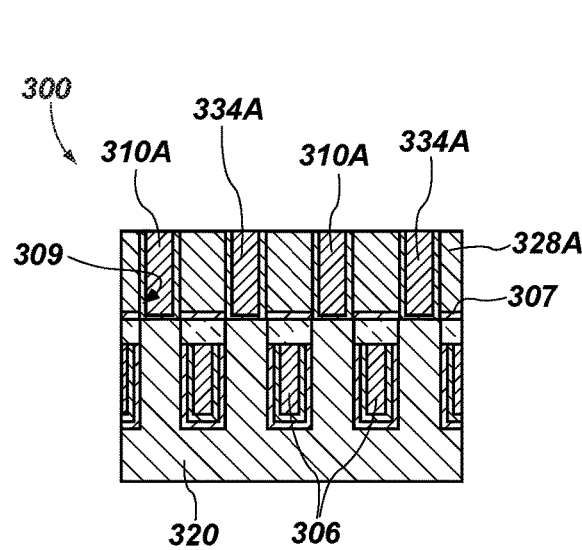

Referring to FIG. 9, openings 309 may be formed through the first interlayer dielectric material 328A and gate dielectric material 307 between adjacent access lines 306, to expose the semiconductor substrate 320. The openings 309 may be filled with one or more conductive materials to form lower source contact portions 310A and lower cell contact portions 334A. The one or more conductive materials may include, for example, an outer conformal layer of titanium nitride and an inner tungsten material. Excess conductive materials, if any, may be removed from over the first interlayer dielectric material 328A, such as by a chemical-mechanical polishing ("CMP") process.

Figure 10:
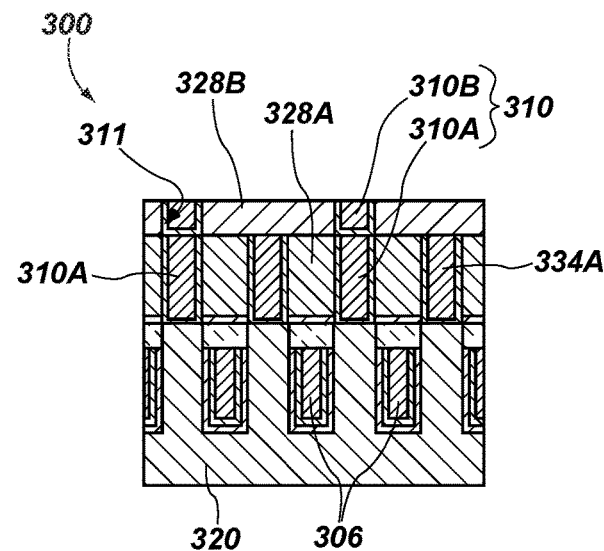

Referring to FIG. 10, a second interlayer dielectric material 328B may be formed over the first interlayer dielectric material 328A, lower source contact portions 310A, and lower cell contact portions 334A. Source contact openings 311 may be formed through the second interlayer dielectric material 328B and over the lower source contact portions 310A to expose the lower source contact portions 310A. One or more conductive materials may be formed in the source contact openings 311 to form upper source contact portions 310B. For example, an outer conformal layer of titanium nitride and an inner tungsten material may be used to form the upper source contact portions 310B. Excess conductive materials, if any, may be removed from over the second interlayer dielectric material 328B, such as by a CMP process. The lower and upper source contact portions 310A, 310B may define source contacts 310.

Figure 11:
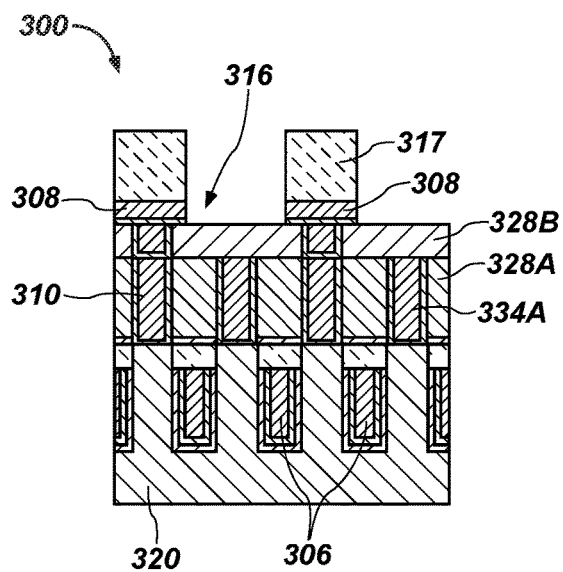

Referring to FIG. 11, a common source 308 may be formed over and in contact with the source contacts 310, and over the second interlayer dielectric material 328A. The common source 308 may be patterned to result in a structure similar to the common source 208 described above with reference to FIG. 3A. Accordingly, openings 316 (e.g., cutouts) may be formed over the lower cell contact portions 334A, but the common source 308 may operably connect adjacent source contacts 310 to each other in both column and row directions. The common source 308 may include a conductive material, such as copper, tungsten, titanium, tantalum, aluminum, gold, conductive silicides thereof, conductive nitrides thereof, or combinations thereof. A dielectric mask material 317 may be formed over the conductive material of the common source 308 and may be used for patterning the common source 308.

Figure 12:
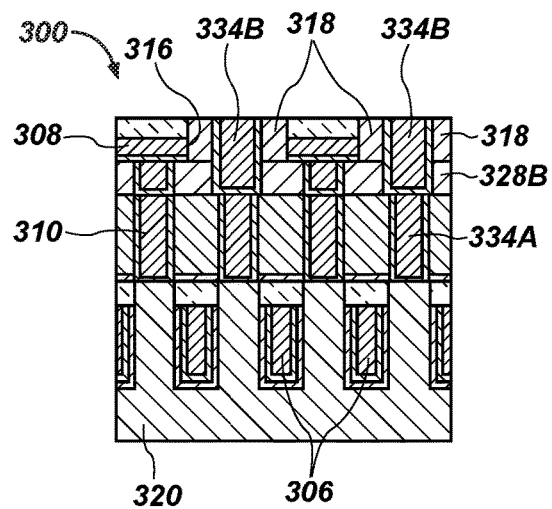

Referring to FIG. 12, upper cell contact portions 334B may be formed over the lower cell contact portions 334A and through the openings 316 in the common source 308. The upper cell contact portions 334B may be formed using a so-called "self-alignment contact" process, as follows. A dielectric spacer material 318, such as a silicon nitride material, may be formed over the dielectric mask material 317 and/or the common source 308. Portions of the dielectric spacer material 318 may be removed from horizontal surfaces, such as by using an anisotropic etch process, while other portions of the dielectric spacer material 318 may remain over vertical surfaces, such as along inner side walls of the openings 316. A sacrificial dielectric material, such as silicon dioxide, having different etch properties than the dielectric spacer material 318 may be formed over the structure. A top surface of the structure may be planarized, such as by a CMP process. Remaining portions of the sacrificial dielectric material (e.g., portions within the openings 316 and between the remaining dielectric spacer materials) may be removed, as well as an underlying portion of the second interlayer dielectric material 328B. This removal process may expose the lower cell contact portions 334A through the openings 316. One or more conductive materials may be formed in the openings 316 and in contact with the lower cell contact portions 334A to form upper cell contact portions 334B, which may extend through the second interlayer dielectric material 328B and through the openings 316 in the common source 308 between the dielectric spacer materials 318. The one or more conductive materials may be, for example, an outer layer of titanium nitride and an inner portion of tungsten. Excess conductive materials, if any, may be removed from over the structure, such as by a CMP process, to result in a structure like that shown in FIG. 12.

The process described with reference to FIGS. 10 through 12 is a process in which the common source 308 is formed prior to the upper cell contact portions 334B. However, the disclosure is not so limited. Rather, the disclosure also includes processes in which the upper cell contact portions 334B are formed over the lower cell contact portions 334A, after which the upper source contact portions 310B and the common source 308 are formed and operably coupled to the lower source contact portions 310A. Given the processes described above, one of ordinary skill in the art is capable of forming the upper bit contact portions 334B prior to the common source 308, as desired.

Figure 13:
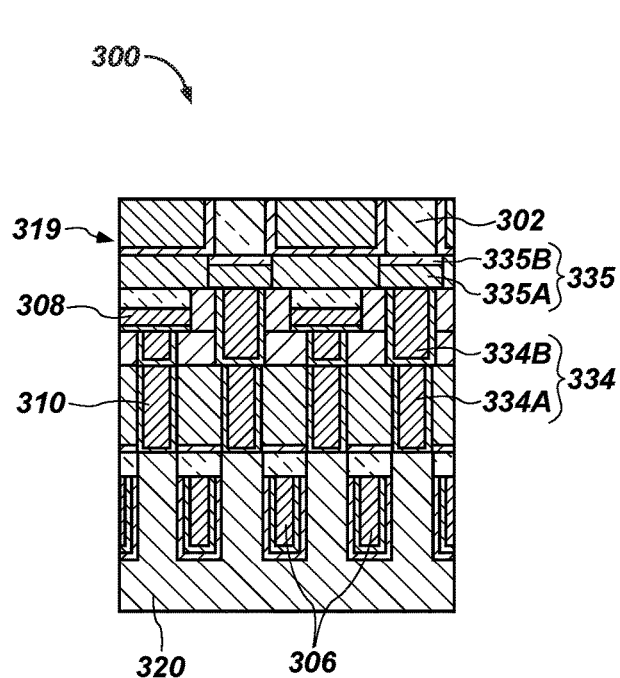

Referring to FIG. 13, an MTJ lower electrode material 335 (including lower MTJ portion 335A and upper MTJ portion 335B) may be formed over the upper cell contact portion 334B such as, for example, for improved adhesion and electrical properties of the MTJs 302 to be formed thereover. The MTJ lower electrode material 335 may include one or more conductive materials, such as a titanium nitride material in the lower MTJ portion 335A formed over and in contact with the upper cell contact portion 334B, and a tantalum material in the upper MTJ portion 335B formed over and in contact with the titanium nitride material. However, one of ordinary skill in the art is capable of selecting the appropriate material(s) for the MTJ lower electrode material 335 considering the material and electrical properties of the MTJs 302. The MTJs 302 may be formed over and in contact with the MTJ lower electrode material 335. The MTJs 302 may be formed as known in the art, such as to have the structure shown in FIG. 1. However, other MTJs 302 are known and capable of implementation with embodiments of this disclosure, as known by one of ordinary skill in the art. The MTJ lower electrode material 335 and MTJs 302 may be formed in and through an upper interlayer dielectric material 319, which may include one or more dielectric materials (e.g., silicon dioxide and silicon nitride). The lower cell contact portions 334A and upper cell contact portions 334B may together define conductive cell contacts 334 (e.g., bit contacts).

Figure 14:
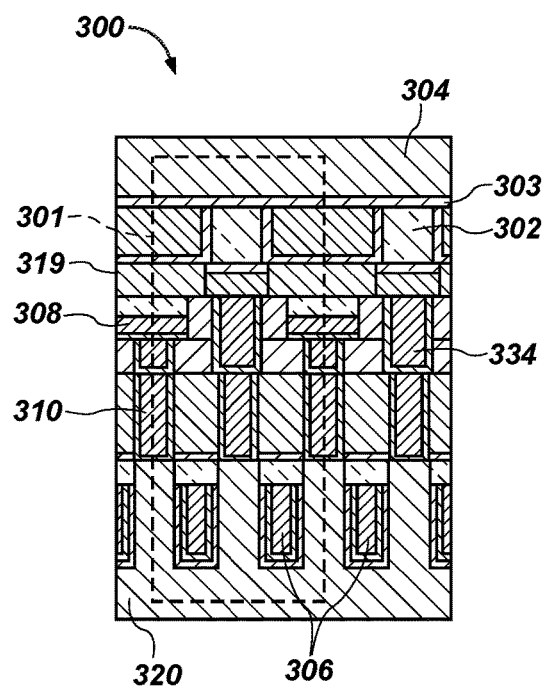

Referring to FIG. 14, data lines 304 (e.g., bit lines) may be formed over the MTJs 302. A material layer 303 may optionally be formed between the data lines 304 and the MTJs 302. In some embodiments, the material layer 303 may be configured to apply a spin current to the MTJs 302. MTJs 302 that are aligned in a row direction may be operably coupled to the same data line 304. The data lines 304 may include one or more conductive materials, such as copper, tungsten, titanium, tantalum, aluminum, gold, conductive silicides thereof, conductive nitrides thereof, or combinations thereof. Each memory cell 301 of the array 300 may include an MTJ 302, a conductive cell contact 334, at least one source contact 310, and a portion of the common source 308. Each memory cell 301 of the array 300 is coupled to an access device (e.g., transistor) operably coupled to at least one access line 306 (e.g., two access lines 306), and a data line 304. The array 300 may, in plan view, have a similar configuration as the array 200 shown in FIG. 3A, for example.

Accordingly, the present disclosure includes methods of fabricating memory devices. In accordance with such methods, an array of memory cells may be formed. Each of the memory cells of the array may be formed by forming at least one access line extending in a first (e.g., column) direction. The access line may be formed in or on a semiconductor substrate. A cell contact may be formed and operably coupled to an access device. A magnetic tunnel junction region may be formed and operably coupled to the cell contact. At least one data line may be formed and operably coupled to the magnetic tunnel junction region and may extend in a second (e.g., row) direction transverse to the column direction. At least one source contact may be formed and operably coupled to the access device. A common source may be formed and operably coupled to the at least one source contact. The common source may be patterned to operably couple the at least one source contact of adjacent memory cells of the array in both the first (e.g., column) direction and the second (e.g., row) direction. The common source may include linear portions extending transverse to one another and extending at an acute angle to each of the first direction and the second direction.

Embodiments of the disclosure may be implemented in STT-MRAM devices as well as other memory devices. Indeed, one of ordinary skill in the art may implement embodiments of the disclosure in a number of different semiconductor devices, example embodiments of which have been described herein.

Figure 15:
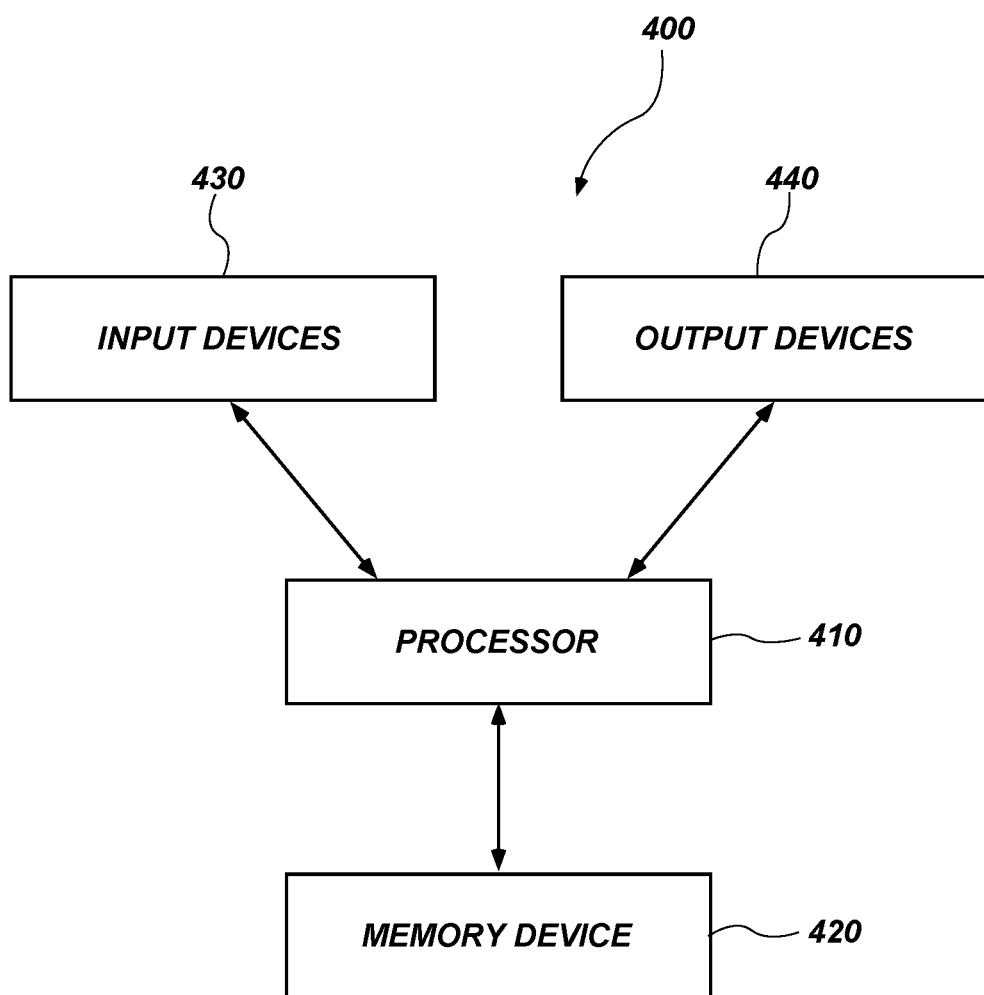
FIG. 15 shows a schematic block diagram of an electronic system according to an embodiment of the present disclosure.

FIG. 15 is a schematic block diagram of an electronic system 400 according to an embodiment of the present disclosure. The electronic system 400 includes a processor 410 operably coupled with a memory device 420, one or more input devices 430, and one or more output devices 440. The electronic system 400 may be a consumer electronic device, such as a desktop computer, a laptop computer, a tablet computer, an electronic reader, a smart phone, or other type of communication device, as well as any type of computing system incorporating a memory device. The memory device 420 may be or include a memory device (e.g., one or more of the memory devices 200, 300) that includes a common source (e.g., one or more of the common sources 208, 308) as discussed above.

Accordingly, the present disclosure includes electronic systems that include a memory device. The electronic systems may include at least one processor, at least one input device and at least one output device operably coupled to the at least one processor, and at least one memory device operably coupled to the at least one processor. The memory device may include an array of memory cells including conductive access lines. The conductive access lines may be formed in or on a semiconductor substrate, conductive data lines, and magnetic tunnel junction regions each operably coupled to and between one of the conductive data lines and, through a conductive cell contact, two of the conductive access lines. The conductive access lines may extend in a first (e.g., column) direction and the conductive data lines may extend in a second (e.g., row) direction transverse to the column direction. Access devices may be operably coupled to the magnetic tunnel junction regions, and each of the access devices may include two channels. A common source may be operably coupled to each of the conductive access lines through a conductive source contact and to each of the memory cells of the array.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

The invention claimed is:

1. A memory device, comprising:
an array of memory cells, comprising:
a magnetic tunnel junction region;
an access line extending in a first direction;
a data line operably coupled to the magnetic tunnel junction region and extending in a second direction transverse to the first direction; and
a common source comprising first linear portions and second linear portions extending transverse to one another, each of the first linear portions and the second linear portions extending at an acute angle to each of the first direction and the second direction, the common source configured to be operably coupled to each memory cell of the array at a source contact operably coupled to an access device corresponding to the access line;
wherein each source contact is located at an intersection of a first linear portion and a second linear portion of the common source.

2. The memory device of claim 1, wherein the magnetic tunnel junction region comprises:
a fixed magnetic region;
a free magnetic region; and
a non-magnetic region between the fixed magnetic region and the free magnetic region.

3. The memory device of claim 2, wherein the fixed magnetic region and the free magnetic region have magnetic orientations perpendicular to a semiconductor substrate over which the magnetic tunnel junction region is located.

4. The memory device of claim 1, wherein the memory cells of the array are staggered, such that a first row of aligned memory cells is offset from a second row of aligned memory cells immediately adjacent to the first row.

5. The memory device of claim 1, wherein the common source comprises a tungsten material.

6. The memory device of claim 1, wherein the access line of each of the memory cells of the array is associated with a dual-gate access device.

7. The memory device of claim 1, wherein the memory device is a dual-channel memory device comprising a first active region and a second active region associated with a common cell contact.

8. The memory device of claim 7, wherein the dual-channel memory device is configured to provide current from a first source contact to a drain region through the first active region and from a second source contact to the drain region through the second active region.

9. An electronic system comprising:
at least one processor;
at least one input device and at least one output device operably coupled to the at least one processor;
at least one memory device operably coupled to the at least one processor, the at least one memory device comprising:
an array of memory cells comprising:
conductive access lines extending in a first direction;
conductive data lines extending in a second direction transverse to the first direction;
magnetic tunnel junction regions each operably coupled to and between one of the conductive data lines and two of the conductive access lines;
access devices operably coupled to the magnetic tunnel junction regions, each of the access devices having two channels; and
a common source configured as a grid operably coupled to each of the conductive access lines and to each of the memory cells of the array at a source contact operably coupled to a respective access device, the common source comprising first linear portions and second linear portions extending transverse to one another and extending at an acute angle to each of the first direction and the second direction, wherein each source contact is located at a grid intersection of a first linear portion and a second linear portion of the common source.

10. The electronic system of claim 9, wherein the first linear portions extend at an angle of between about 35 degrees and about 55 degrees from the conductive data lines, and the second linear portions extend at an angle of between about 35 degrees and about 55 degrees from the conductive access lines.

11. The electronic system of claim 9, wherein the access devices comprise dual-channel transistors, each of the dual-channel transistors comprising opposing source regions and a common drain region.

12. The electronic system of claim 11, wherein each of the dual-channel transistors comprises two active regions, each of the two active regions being located between a respective source region and the common drain region.

13. The electronic system of claim 9, wherein the conductive access lines are positioned in trenches formed in a semiconductor substrate.

14. The electronic system of claim 9, wherein each of the magnetic tunnel junction regions comprises a lower portion comprising a titanium nitride material and an upper portion comprising a tantalum material.

15. A method of forming an array of memory cells, comprising:
   forming an access device having an access line extending in a first direction;
   forming a cell contact operably coupled to the access device;
   forming a magnetic tunnel junction region over the cell contact;
   forming a data line operably coupled to the magnetic tunnel junction region, the data line extending in a second direction transverse to the first direction; and
   forming a common source comprising first linear portions and second linear portions extending transverse to one another and extending at an acute angle to each of the first direction and the second direction, the common source operably coupled to source contacts of the memory cells of the array, wherein each source contact is located at an intersection of a first linear portion and a second linear portion of the common source.

16. The method of claim 15, wherein the common source is formed prior to the cell contact being formed and operably coupled to the access line.

17. The method of claim 15, wherein forming the access device comprises:
   forming two trenches in a semiconductor substrate; and
   filling the two trenches with at least one conductive material to define two access lines associated with the access device.

18. The method of claim 15, wherein forming the common source comprises forming an opening in the common source through which the cell contact extends.

19. The method of claim 15, wherein forming the access device comprises forming two channels configured to provide two separate sources of current to a common cell contact.

20. The method of claim 15, wherein forming the common source comprises forming the first linear portions and the second linear portions to extend at angles of between about 35 degrees and about 55 degrees from the first direction and the second direction.

* * * * *

UNITED STATES PATENT AND TRADEMARK OFFICE
CERTIFICATE OF CORRECTION

PATENT NO.        : 10,727,271 B2
APPLICATION NO.   : 15/982251
DATED             : July 28, 2020
INVENTOR(S)       : Shigeru Sugioka Page 1 of 1

It is certified that error appears in the above-identified patent and that said Letters Patent is hereby corrected as shown below:

On the Title Page
In ITEM (73) Assignee: change "Micron Trechnology Inc.," to --Micro Technology, Inc.,--

Signed and Sealed this
Sixth Day of October, 2020

Andrei Iancu
*Director of the United States Patent and Trademark Office*